(12) United States Patent
Lin

(10) Patent No.: US 9,944,546 B2
(45) Date of Patent: *Apr. 17, 2018

(54) ANION EXCHANGE MEMBRANES AND PROCESS FOR MAKING

(71) Applicant: EVOQUA WATER TECHNOLOGIES LLC, Warrendale, PA (US)

(72) Inventor: Juchui Ray Lin, Bedford, MA (US)

(73) Assignee: Evoqua Water Technologies LLC, Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/603,098

(22) Filed: Jan. 22, 2015

(65) Prior Publication Data
US 2015/0299001 A1 Oct. 22, 2015

Related U.S. Application Data

(63) Continuation of application No. 13/879,519, filed as application No. PCT/US2011/056501 on Oct. 17, 2011, now Pat. No. 8,969,424.

(60) Provisional application No. 61/393,715, filed on Oct. 15, 2010.

(51) Int. Cl.
| | |
|---|---|
| *C02F 1/46* | (2006.01) |
| *C08F 212/14* | (2006.01) |
| *C08F 226/06* | (2006.01) |
| *C08F 12/18* | (2006.01) |
| *C02F 1/469* | (2006.01) |
| *B01D 67/00* | (2006.01) |
| *H03K 5/01* | (2006.01) |
| *B01D 61/44* | (2006.01) |
| *C08J 5/22* | (2006.01) |
| *H03K 5/00* | (2006.01) |

(52) U.S. Cl.
CPC ........ *C02F 1/4693* (2013.01); *B01D 67/0002* (2013.01); *C08F 12/18* (2013.01); *C08F 212/14* (2013.01); *C08F 226/06* (2013.01); *H03K 5/01* (2013.01); *B01D 61/44* (2013.01); *C02F 2201/46* (2013.01); *C08J 5/2206* (2013.01); *C08J 2327/06* (2013.01); *C08J 2379/06* (2013.01); *H03K 2005/00286* (2013.01)

(58) Field of Classification Search
CPC .... B01D 67/0002; B01D 61/44; C08J 5/2206; C08J 2327/06; C08J 2379/06; C08F 226/06; C08F 212/14; C08F 12/18; C02F 1/4693; C02F 2201/46
USPC .......... 521/27; 204/295, 296, 638
See application file for complete search history.

(56) References Cited

U.S. PATENT DOCUMENTS

| | | |
|---|---|---|
| 2,780,604 A | 2/1957 | Clarke et al. |
| 3,009,895 A | 11/1961 | Slocombe |
| 3,549,016 A | 12/1970 | Rigopulos |
| 3,737,045 A | 6/1973 | Hashimoto et al. |
| 3,926,864 A | 12/1975 | Hodgdon, Jr. |
| 4,231,855 A | 11/1980 | Hodgdon et al. |
| 4,297,431 A | 10/1981 | Sullivan |
| 4,585,833 A | 4/1986 | Domeier |
| 4,704,324 A | 11/1987 | Davis et al. |
| 4,778,601 A | 10/1988 | Lopatin et al. |
| 4,828,772 A | 5/1989 | Lopatin et al. |
| 4,874,567 A | 10/1989 | Lopatin et al. |
| 4,933,405 A | 6/1990 | Evani |
| 5,032,274 A | 7/1991 | Yen et al. |
| 5,039,420 A | 8/1991 | Klein et al. |
| 5,118,717 A | 6/1992 | Hodgdon et al. |
| 5,120,632 A | 6/1992 | Bertrand et al. |
| 5,145,618 A | 9/1992 | MacDonald et al. |
| 5,194,189 A | 3/1993 | Papastavros et al. |
| 5,264,125 A | 11/1993 | MacDonald et al. |
| 5,380,413 A | 1/1995 | Posar et al. |
| 5,401,408 A | 3/1995 | Umemura et al. |
| 5,447,636 A | 9/1995 | Banerjee |
| 5,510,394 A | 4/1996 | Hodgdon |
| 5,714,521 A | 2/1998 | Kedem et al. |
| 5,814,197 A | 9/1998 | Batchelder et al. |
| 5,849,167 A | 12/1998 | Posar |
| 5,868,976 A | 2/1999 | Puglia et al. |
| 5,961,796 A | 10/1999 | Hitchens et al. |
| 6,013,724 A | 1/2000 | Mizutani et al. |

(Continued)

FOREIGN PATENT DOCUMENTS

| | | |
|---|---|---|
| CN | 1114237 A | 1/1996 |
| CN | 1986613 A | 6/2007 |

(Continued)

OTHER PUBLICATIONS

J.C. Salamone et al: "Polymerization of Vinylpyridinium Salts. XIII. Preparation of CVinyl-N-Methylpyridinium pStyrenesulfonate Charge Transfer Ion-Pair Comonomer", Dec. 31, 1985, XP055104794, Retrieved from the Internet: URL:http://onlinelibrary.wiley.com/store/10.1002/pol.1985.130231210/asset/130231210_ftp.pdf?v-1&t-hs6a53wy&s-e4772bb8729bf774cd920c40734d5b18cad056d1 [retrieved on Feb. 27, 2014] *p. 656, paragraph 7* *p. 658, paragraph 3*.

(Continued)

*Primary Examiner* — Michael M Bernshteyn

(57) ABSTRACT

Embodiments of the present invention provide for anion exchange membranes and processes for their manufacture. The anion exchange membranes described herein are made the polymerization product of at least one functional monomer comprising a tertiary amine which is reacted with a quaternizing agent in the polymerization process.

28 Claims, 1 Drawing Sheet

(56) References Cited

U.S. PATENT DOCUMENTS

| | | | |
|---|---|---|---|
| 6,117,297 A * | 9/2000 | Goldstein | B01D 53/228 204/627 |
| 6,217,733 B1 | 4/2001 | Hurwitz et al. | |
| 6,221,248 B1 | 4/2001 | Lin et al. | |
| 6,258,276 B1 | 7/2001 | Mika et al. | |
| 6,277,512 B1 | 8/2001 | Hamrock et al. | |
| 6,344,584 B2 | 2/2002 | Lin et al. | |
| 6,368,486 B1 | 4/2002 | Thompson et al. | |
| 6,410,672 B1 | 6/2002 | MacDonald et al. | |
| 6,423,205 B1 | 7/2002 | Akahori et al. | |
| 6,596,137 B2 | 7/2003 | Nago et al. | |
| 6,723,758 B2 | 4/2004 | Stone et al. | |
| 6,814,865 B1 | 11/2004 | Aminabhavi et al. | |
| 6,828,386 B2 | 12/2004 | MacKinnon | |
| 6,830,671 B2 | 12/2004 | Aritomi et al. | |
| 6,849,688 B2 | 2/2005 | Hellums | |
| 6,851,561 B2 | 2/2005 | Wu et al. | |
| 6,924,318 B2 | 8/2005 | Mischi et al. | |
| 7,081,484 B2 | 7/2006 | Sugaya et al. | |
| 7,087,654 B2 | 8/2006 | MacDonald et al. | |
| 7,201,832 B2 | 4/2007 | Yamanaka et al. | |
| 7,247,370 B2 | 7/2007 | Childs et al. | |
| 7,316,919 B2 | 1/2008 | Childs et al. | |
| 7,318,972 B2 | 1/2008 | Highgate | |
| 7,368,200 B2 | 5/2008 | Zhu et al. | |
| 7,396,465 B2 | 7/2008 | Wu et al. | |
| 7,425,583 B2 | 9/2008 | Inoue et al. | |
| 7,449,111 B2 | 11/2008 | Hedhli et al. | |
| 7,514,481 B2 | 4/2009 | Yandrasits et al. | |
| 7,544,278 B2 | 6/2009 | Aminabhavi et al. | |
| 7,632,406 B2 | 12/2009 | Wilson et al. | |
| 7,649,025 B2 | 1/2010 | Kitamura et al. | |
| 7,674,505 B2 | 3/2010 | Kerres et al. | |
| 7,740,967 B2 | 6/2010 | Oren et al. | |
| 7,790,837 B2 | 9/2010 | McGrath et al. | |
| 7,829,218 B2 | 11/2010 | Endo et al. | |
| 7,833,644 B2 | 11/2010 | Chokai et al. | |
| 7,868,124 B2 | 1/2011 | Balland-Longeau et al. | |
| 7,888,397 B1 | 2/2011 | Hibbs et al. | |
| 7,893,303 B2 | 2/2011 | Yamakawa et al. | |
| 7,901,831 B2 | 3/2011 | Brunea | |
| 7,910,236 B2 | 3/2011 | Hommura et al. | |
| 7,923,166 B2 | 4/2011 | Fukuta et al. | |
| 7,931,995 B2 | 4/2011 | Bahar et al. | |
| 7,938,941 B2 | 5/2011 | Kashiwada et al. | |
| 7,947,196 B2 | 5/2011 | Lee et al. | |
| 7,959,780 B2 | 6/2011 | Hawkins et al. | |
| 7,968,663 B2 | 6/2011 | MacDonald et al. | |
| 7,977,392 B2 | 7/2011 | MacKinnon et al. | |
| 8,075,951 B2 | 12/2011 | Hammond-Cunningham et al. | |
| 8,114,550 B2 | 2/2012 | Suzuki et al. | |
| 8,349,155 B2 | 1/2013 | Umemura et al. | |
| 8,367,267 B2 | 2/2013 | Frey et al. | |
| 8,703,831 B2 * | 4/2014 | Lin | B01D 61/44 204/295 |
| 8,969,424 B2 | 3/2015 | Lin | |
| 9,023,902 B2 * | 5/2015 | Lin | B01D 61/44 204/295 |
| 2002/0019448 A1 | 2/2002 | Sugaya et al. | |
| 2002/0045085 A1 | 4/2002 | Formato et al. | |
| 2003/0024816 A1 | 2/2003 | Aritomi et al. | |
| 2003/0105173 A1 | 6/2003 | Sugaya et al. | |
| 2004/0175625 A1 | 9/2004 | Hedhli et al. | |
| 2004/0241518 A1 | 12/2004 | Yang | |
| 2005/0011826 A1 | 1/2005 | Childs et al. | |
| 2005/0250919 A1 | 11/2005 | Caneba et al. | |
| 2006/0000778 A1 | 1/2006 | Childs et al. | |
| 2006/0045985 A1 | 3/2006 | Kozak | |
| 2007/0020499 A1 | 1/2007 | Suzuki et al. | |
| 2007/0031716 A1 | 2/2007 | Rajendran | |
| 2007/0261962 A1 | 11/2007 | Gajek | |
| 2008/0023334 A1 | 1/2008 | Nakagawa et al. | |
| 2008/0223785 A1 | 9/2008 | Miller et al. | |
| 2009/0137757 A1 | 5/2009 | Imuta et al. | |
| 2009/0155370 A1 * | 6/2009 | Cope | A61K 9/5026 424/497 |
| 2010/0056650 A1 | 3/2010 | Highgate | |
| 2010/0062313 A1 | 3/2010 | Browning et al. | |
| 2010/0065490 A1 | 3/2010 | Balster et al. | |
| 2010/0239946 A1 | 9/2010 | Miyachi et al. | |
| 2011/0020730 A1 | 1/2011 | Mizuno et al. | |
| 2011/0068002 A1 | 3/2011 | Lin et al. | |
| 2011/0097645 A1 | 4/2011 | Van Baak et al. | |
| 2011/0132762 A1 | 6/2011 | O'Brien et al. | |
| 2011/0147308 A1 | 6/2011 | Johnston-Hall et al. | |
| 2011/0189585 A1 | 8/2011 | Brunea | |
| 2011/0200907 A1 | 8/2011 | Moon et al. | |
| 2011/0203990 A1 | 8/2011 | Murphy et al. | |
| 2011/0224314 A1 | 9/2011 | MacDonald et al. | |
| 2011/0281197 A1 | 11/2011 | Daikoku et al. | |
| 2011/0290727 A1 | 12/2011 | Van Engelen | |
| 2012/0006685 A1 | 1/2012 | Van Engelen | |
| 2012/0014858 A1 | 1/2012 | Rowell | |
| 2012/0024697 A1 | 2/2012 | Antheunis et al. | |
| 2012/0031834 A1 | 2/2012 | Higa et al. | |
| 2012/0035280 A1 | 2/2012 | Jikihara et al. | |
| 2012/0248028 A1 | 10/2012 | Antheunis et al. | |
| 2012/0248029 A1 | 10/2012 | Antheunis et al. | |
| 2012/0248030 A1 | 10/2012 | Antheunis et al. | |
| 2012/0248032 A1 | 10/2012 | Van Berchum et al. | |
| 2012/0329891 A1 | 12/2012 | Lee et al. | |

FOREIGN PATENT DOCUMENTS

| | | |
|---|---|---|
| JP | S63-503074 A | 11/1988 |
| JP | 2000-503898 A | 4/2000 |
| JP | 2001-157823 A | 6/2001 |
| JP | 2005-334263 A | 12/2005 |
| JP | 2006-519273 A | 8/2006 |
| JP | 2008-255351 A | 10/2008 |
| JP | 2008288065 A | 11/2008 |
| JP | 2009144041 A * | 7/2009 |
| JP | 2009-173786 A | 8/2009 |
| JP | 2009-173828 A | 8/2009 |
| JP | 2009-215499 A | 9/2009 |
| JP | 2009-215500 A | 9/2009 |
| WO | 0193361 A2 | 12/2001 |
| WO | 03008078 A2 | 1/2003 |
| WO | 2004073843 A1 | 9/2004 |
| WO | 2005102503 A1 | 11/2005 |
| WO | 2010007399 A1 | 1/2010 |
| WO | 2010013861 A1 | 2/2010 |
| WO | 2010106356 A1 | 9/2010 |
| WO | 2010106357 A1 | 9/2010 |
| WO | 2011025867 A1 | 3/2011 |
| WO | 2012051608 A1 | 4/2012 |
| WO | 2012051610 A1 | 4/2012 |
| WO | 2012081026 A2 | 6/2012 |
| WO | 2013014420 A1 | 1/2013 |
| WO | 2013052227 A1 | 4/2013 |

OTHER PUBLICATIONS

Pandey, Ashok K. et al., "Formation of Pore-Filled Ion-Exchange Membranes within Situ Crosslinking: Poly (Vinylbenzyl Ammonium Salt)-Filled Membranes", Journal of Polymer Science Part A: Polymer Chemistry, vol. 39, No. 6, Mar. 15, 2001.

* cited by examiner

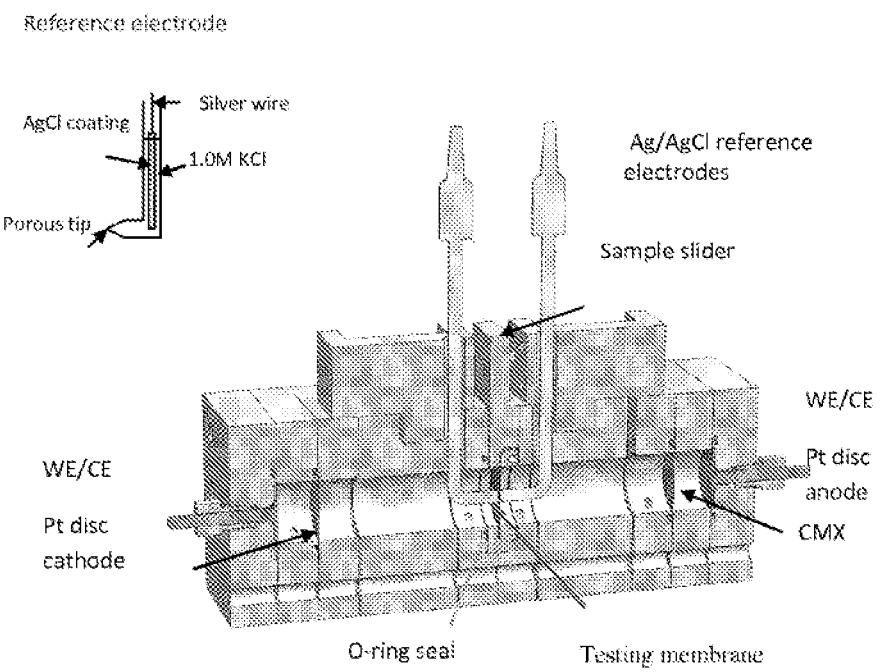
Construction of the membrane test cell and the reference electrode

ANION EXCHANGE MEMBRANES AND PROCESS FOR MAKING

CROSS-REFERENCE TO RELATED APPLICATIONS

This application is a continuation of U.S. patent application Ser. No. 13/879,519 (now U.S. Pat. No. 8,969,424) which is a U.S. national phase application of International Patent Application Serial No. PCT/US2011/056501 filed on Oct. 17, 2011, which in turn claims the benefits of U.S. provisional application 61/393,715 filed on Oct. 15, 2010.

FIELD

Embodiments of the present invention provide for anion exchange membranes and processes for their manufacture.

BACKGROUND

Anion exchange membranes transport anions under an electrical or chemical potential. Anion exchange membranes will have fixed positive charges and mobile negatively charged anions. Ion exchange membrane properties are controlled by the amount, type and distribution of the fixed ionic groups. Quaternary and tertiary amines respectively produce the fixed positive charged groups in strong and weak base anion exchange membranes.

Among the most important applications of ion exchange membranes are desalination of water by electrodialysis (ED), as a power generating sources in reverse electrodialysis and as separators in fuels cells. Other applications include recovery of metal ions in the electroplating and metal finishing industries and various applications in the food and beverage industry.

Electrodialysis desalinates water by transferring ions and some charged organics through paired cation and anion selective membranes under the motive force of a direct current voltage. An ED apparatus consists of electrically conductive and substantially water impermeable cation selective and anion selective membranes arranged as opposing walls of a cell. Adjacent cells form a cell pair. Membrane stacks consist of many, sometime hundreds of cell pairs, and an ED systems may consist of many stacks. Each membrane stack has a DC (direct current) anode at one end of the stack and a DC cathode at the other end. Under a DC voltage, ions move to the electrode of opposite charge.

A cell pair consists of two types of cells, a diluting cell and a concentrating cell. As an illustrative example, consider a cell pair with a common cation exchange membrane wall and two anion exchange membrane walls forming the two cells. That is, a first anion exchange membrane and the cation exchange membrane form the dilute cell and the cation exchange membrane and a second anion membrane form the concentrating cell. In the diluting cell, cations will pass through the cation exchange membrane facing the anode, but be stopped by the paired anion exchange membrane of the concentrating cell in that direction facing the cathode. Similarly, anions pass through the anion exchange membrane of the diluting cell facing the cathode, but will be stopped by the cation exchange membrane of the adjacent pair facing the anode. In this manner, salt in a diluting cell will be removed and in the adjacent concentrating cells cations will be entering from one direction and anions from the opposite direction. Flow in the stack is arranged so that the dilute and concentrated flows are kept separate and a desalinated water stream is produced from the dilute flow.

In the ED process, material commonly builds up at the membrane surface in the direction of the electric field, which can, and usually does reduce process efficiency. To combat this effect, Electrodialysis reversal (EDR) was developed and is the primary method of use presently. In EDR, the electrodes are reversed in polarity on a regular basis, for example, every fifteen to sixty minutes. The dilute and concentrate flows are simultaneously switched as well, the concentrate becoming the dilute flow and vice versa. In this way fouling deposits are removed and flushed out.

Once the concentration in the dilution cells falls to lower than about 2000 milligrams/liter (mg/l), electrical resistance is at a level that power demand becomes increasingly expensive. To overcome this, and to be able to produce high quality water, electrodeionization (EDI), sometimes called continuous electrodeionization (CEDI) was developed. In this method the cells are filled with ion exchange media, usually ion exchange resin beads. The ion exchange media is orders of magnitude more conductive than the solution. The ions are transported by the beads to the membrane surface for transfer to the concentrate cells. EDI is capable of producing purer water then ED at less power when the feed concentration is reduced sufficiently.

ED processes for water desalination have advantages over RO. They require less pretreatment which will reduce operating costs. They will have higher product water recovery and a higher brine concentration, i.e., there is less brine to dispose.

Univalent selective or monovalent selective membranes primarily transfer monovalent ions. Monovalent selective cation exchange membranes primarily transfer sodium, potassium, etc. Likewise, monovalent selective anion membranes transfer ions such as chloride, bromide, nitrate etc.

Reverse osmosis (RO) dominates the production of fresh water from seawater by membrane processes. While electrodialysis (ED) is used for brackish water and waste water desalination, it is generally considered too expensive for seawater use. In order to be competitive with RO, ED and EDR will require membrane resistance of less than 1 ohm-cm$^2$, preferably less than 0.8 ohm-cm$^2$, and most preferably less than 0.5 ohm-cm$^2$. Ion permselectivity of greater than 90%, more preferably greater than 95%, and most preferably greater than 98% is desired. The membrane has to have long service life, and be physically strong and chemically durable and be low cost.

Reverse electrodialysis (RED) converts the free energy generated by mixing the two aqueous solutions of different salinities into electrical power. The greater the difference in salinity, the greater the potential for power generation. For example, researchers have studied RED using Dead Sea water and fresh or seawater. Researchers in Holland have mixed river water entering the sea and seawater. RED membranes preferably will have a low electrical resistance and a high co-ion selectivity and long service life time, acceptable strength and dimensional stability and, importantly, low cost.

The polymer electrolyte membrane (PEM) is a type of ion exchange membrane that serves both as the electrolyte and as a separator to prevent direct physical mixing of the hydrogen from the anode and oxygen supplied to the cathode. A PEM contains positively charged groups, usually sulfonic acid groups, attached or as part of the polymer making up the PEM. Protons migrate through the membrane by jumping from one fixed positive charge to another to permeate the membrane. PEM's requirements include chemical, thermal and electrochemical stability, and adequate mechanical stability and strength when swollen and under mechanical stress. Other requirements include low resistance, low or preferably no methanol transport in direct methanol fuel cells (DMFC), and low cost.

Bipolar membranes are made of a cation exchange and an anion exchange membrane laminated or bound together, sometimes with a thin neutral layer between. Under an electric field water is split into H+ and OH– ions. The hydroxyl ions are transported through the anion exchange membrane and the H+ ions through the anion exchange layer and will form base and acid in the respective cells. Organic acids are also made using bipolar membranes.

Development of ion exchange membranes requires an optimization of properties in order to overcome competing effects. Ion exchange membranes for water desalination traditionally have had to meet four main characteristics to be considered successful. These are:

Low electrical resistance to reduce potential drop during operation and to increase energy efficiency High permselectivity—that is, high permeability to counter-ions but approximately impermeable to co-ions High chemical stability—ability to withstand pH from 0 to 14 and oxidizing chemicals Mechanical strength—The membrane must be able to withstand the stresses of being handled while being manufactured into a module or other processing device. The membrane must also have good dimensional stability in operation and not swell or shrink excessively when the fluid contacting it changes concentration or temperature.

Membrane developers have recognized that for a given chemistry used to make an ion exchange membrane, a thinner membrane would give a lower resistance and also allow more membrane area per unit volume of device. However, thinner membranes are more susceptible to dimensional change from environmental effects, such as changes in ionic concentration of the fluids contacting them or operating temperature changes. Moreover, to develop and produce defect-free membranes is more difficult for the case of thinner membranes because there is less margin of error during membrane production as there is for thicker membranes where the membrane thickness covers over defects that may occur in membrane formation.

BRIEF DESCRIPTION OF THE DRAWINGS

FIG. 1 presents a schematic representation of the construction of a membrane test cell and reference electrode as described in the accompanying examples.

DETAILED DESCRIPTION

International Application# PCT/US 10/46777 incorporated in its entirety by reference describes a method of making ion exchange membranes produced by polymerizing one or more monofunctional ionogenic monomers with at least one multifunctional monomer in the pores of a porous substrate.

As described herein the inventor has found that by using functional monomers having a tertiary amine group with a quaternizing chemical, anion exchange membranes of low resistance high permeability and good chemical resistance can be made. The quaternary ammonium functional groups are strongly basic and ionized to act over the pH range of 0 to 13 allowing a broad operational range. Of particular utility are vinyl compounds having nitrogen containing rings.

Preferred tertiary amine monomers are vinylimidazole and vinylcarbazole.

The tertiary amine containing monomer is polymerized with at least one crosslinking monomer and at least one quaternizing agent and one or more polymerization initiators to form the ionogenic polymer in the pores of the porous substrate.

The tertiary amine containing monomer may be copolymerized with at least one secondary functional monomer such as but not limited to; vinylbenzyltrimethylammonium chloride, trimethylammonium ethylmethacyrlic chloride, methacrylamidopropyltrimethylammonium chloride, (3-acrylamidopropyl)trimethylammonium chloride, 2-vinylpyridine, and 4-vinylpyridine, at least one crosslinking monomer and at least one quaternizing agent, and one or more polymerization initiators.

Furthermore, either of these methods may be done with at least one added nonfunctional secondary monomer such as but not limited to; styrene, vinyl toluene, 4-methylstyrene, t-butyl styrene, alpha-methylstyrene, methacrylic anhydride, methacrylic acid, n-vinyl-2-pyrolidone, vinyltrimethoxysilane, vinyltriethoxysilane, vinyl-tris-(2-methoxyethoxy)silane, vinylidene chloride, vinylidene fluoride, vinylmethyldimethoxysilane, 2,2,2,-trifluoroethyl methacrylate allyamine, vinylpyridine, maleic anhydride, glycidyl methacrylate, hydroxyethylmethacrylate, methylmethacrylate, or ethylmethacrylate.

The at least one crosslinker is preferably divinylbenzene or ethylene glycol dimethacrylate.

Optionally, at least one crosslinker may be chosen from propylene glycol dimethacrylate, isobutylene glycol dimethacrylate, Octa-vinyl POSS® (Hybrid Plastics, OL1160) ($C_{16}H_{24}O_{12}Si_8$), Octavinyldimethylsilyl POSS® (Hybrid Plastics, OL1163) ($C_{32}H_{72}O_{20}Si_{16}$), Vinyl POSS® Mixture (Hybrid Plastics, OL1170) (($CH_2CH)_n(SiO_{1.5})_n$, wherein n=8, 10, or 12), Trisilabolethyl POSS® (Hybrid Plastics, SO1444) ($C_{14}H_{38}O_{12}Si_7$), Trisilanolisobutyl POSS® (Hybrid Plastics, SO1450) ($C_{28}H_{66}O_{12}Si_7$), Trisilanolisooctyl POSS® (Hybrid Plastics, SO1455) ($C_{56}H_{122}O_{12}Si_7$), Octasilane POSS® (Hybrid Plastics, SH1310) ($C_{16}H_{56}O_{20}Si_{16}$), Octahydro POSS® (Hybrid Plastics, SH1311) ($H_8O_{12}Si_8$), epoxycyclohexyl-POSS® cage mixture (Hybrid Plastics, EP0408M) (($C_8H_{13}O)_n(SiO_{1.5})_n$, wherein n=8, 10, or 12), glycidyl-POSS® cage mixture (Hybrid Plastics, EP0409) (($C_6H_{11}O_2)_n(SiO_{1.5})_n$, wherein n=8, 10, or 12), methacryl POSS® Cage Mixture (Hybrid Plastics, MA0735) (($C_7H_{11}O_2)_n(SiO_{1.5})_n$, wherein n=8, 10 or 12), or Acrylo POSS® Cage Mixture (Hybrid Plastics, MA0736) (($C_6H_9O_2)_n(SiO_{1.5})_n$, wherein n=8, 10, or 12).

Solvents found useful are N-propanol and dipropylene glycol. Similar hydroxy containing solvents, such as alcohols, for example isopropanol, butanol; diols such as various glycols, or polyols, such as glycerine may be useful in some cases. Additionally aprotic solvents such as N-methylpyrrolidone and dimethylacetamide may be used. These are given as examples, not to be limiting to a practitioner. Dipropylene glycol is a preferred solvent.

Free radical initiators useful for the present invention include, but are not limited to; benzoyl peroxide (BPO), ammonium persulfate, 2,2'-azobisisobutyronitrile (AIBN), 2,2'-azobis(2-methylpropionamidine)dihydrochloride, 2,2'-Azobis[2-(2-imidazolin-2yl)propane] dihydrochloride, 2, 2'-Azobis [2-(2-imidazolin-2-yl)propane] and dimethyl 2,2'-azobis(2-methylpropionate).

A person skilled in the art of membrane development and manufacturing will realize that this convenient laboratory method can be adapted to other laboratory scaled methods and may be scaled up to continuous manufacturing.

For example, the substrate pore filling or saturation may be done at a slightly elevated temperature (>40° C.) to reduce air solubility, or this step could be done after a mild vacuum treatment of the substrate sample submerged in the formulation solution. Substrate samples may be presoaked and then placed on the polyester or similar sheet and covered with a covering sheet and smoothed out to remove air bubbles. Several presoaked pieces may be layered and then placed on the polyester or similar sheet and covered with a covering sheet and smoothed out to remove air bubbles.

Rather than heating in an oven, the saturated substrate sandwich may be placed on a heated surface at a temperature sufficient and for a time necessary to initiate and complete polymerization. Alternate methods for initiation of the polymerization reaction may be used. Ultraviolet light or ionizing radiation, such as gamma radiation or electron beam radiation may be used to initiate the polymerization reaction.

Low resistance reduces the electrical energy required to desalinate and lowers operating cost. Specific membrane resistance is measured in Ohm-centimeters (Ωcm). A more convenient engineering measure is area resistance, Ohm-cm2 (Ωcm2).

Area resistance may be measured by using a cell having two electrodes of known area, platinum or black graphite are typically used, with the membrane sample of known area between them in an electrolyte solution. The electrodes do not touch the membrane. Membrane resistance is estimated by subtracting the electrolyte resistance without the membrane from the test result with the membrane in place. The resistance may also be measured by determining a voltage vs. current curve in a cell having two well stirred chambers separated by the membrane. A calomel electrode measures the potential drop across the membrane. The slope of the potential drop vs. current curves, which may be obtained by varying voltage and measuring current. Electrochemical impedance may also be used. In this method, alternating current is applied across the membrane. Measurement at a single frequency gives data relating to electrochemical properties of the membrane. By using frequency and amplitude variations, detailed structural information may be obtained. Herein, resistance will be defined by the methods described in the Experimental section.

Permselectivity refers to the relative transport of counterions to co-ions during electrodialysis. For an ideal cation exchange membrane only positively charged ions would pass the membrane, giving a permselectivity of 1.0. Permselectivity is found by measuring the potential across the membrane while it separates monovalent salt solutions of different concentrations. The method and calculations used herein are described in the Experimental section.

To meet these initial goals the inventors developed a type of composite ion exchange membrane in which a crosslinked polymer having charged ionic groups attached is contained in the pores of a microporous membrane substrate. The porous membrane substrate is preferably less than about approximately 155 microns thick, more preferably less than about approximately 55 microns thick.

Substrate membranes having porosity greater than about 45% are preferred, with those having porosities greater than about 60% more preferred. In the most preferred embodiments, the substrate membranes have porosities greater than about 70%. Preferred substrate membranes have a rated pore size of from about approximately 0.05 microns to about approximately 10 microns, with a more preferred range of from about approximately 0.1 microns to about approximately 1.0 microns. Most preferred porous substrates have a rated pore size of from about approximately 0.1 microns to about approximately 0.2 microns.

Microporous membrane supports may be manufactured from polyolefins, polyolefin blends, polyvinylidene fluoride, or other polymers. A class of preferred substrates comprises thin polyolefin membranes manufactured primarily for use as battery separators. A more preferred substrate class are thin battery separators manufactured from ultrahigh molecular weight polyethylene (UHMWPE).

To produce the desired ion exchange membranes, the inventors developed a method of placing the crosslinked charged polymer in the pores of the substrate by polymerizing the crosslinked polymer in these pores. The method involved saturating the porous substrate with a solution of charged monomer, multifunctional monomer, (e.g., a cross-linking agent) and polymerization initiator. Herein we use the term ionogenic monomer to mean a monomer species having at least one charged group covalently attached. The charged group can be positively charged or negatively charged. In an embodiment, the crosslinked polymer was produced by polymerizing a multifunctional charged monomer. The Polymerization was initiated by heat or by UV light, preferably with a polymerization initiator such as a free radical initiator. Monofunctional monomers are monomers which have a single site for carrying forward the polymerization reaction. Multifunctional monomers have more than one polymerization reaction site and so can form networked or crosslinked polymers.

The following laboratory method was used to investigate formulation and process effects by producing small coupons for resistivity and permselectivity testing. Porous membrane substrate 43 mm diameter coupons were die cut. Somewhat larger discs (50 mm or 100 mm diameter) of transparent polyester sheets were also die cut. A 105 mm aluminum weighing boat was typically used to hold a set of coupons. The coupons were sandwiched between two polyester film discs. First, substrate coupons were thoroughly wetted with a monomer solution to make up a test sample. This was done by adding the formulated solution to the aluminum boat, and immersing a polyester film disc with a substrate coupon layered on it into the solution so that the porous support is saturated. The saturated support was then removed from the monomer solution and placed on a piece of polyester film. Air bubbles were removed from the coupon by, for example, smoothing or squeezing the coupon with a convenient tool, such as a small glass rod, or by hand. A second polyester disc was then layered on top of the first coupon and smoothed to have complete surface contact between the coupon and the lower and upper polyester film layers. A second porous substrate was then layered on the upper polyester film and the saturation, smoothing and addition of a over layer of polyester film repeated to give a multilayer sandwich of two coupons and three protective polyester film layers. A typical experimental run would have a multilayered sandwich of 10 or more saturated substrate coupon layers. The rim of the aluminum boat can be crimped down to hold the disc/coupon assembly if required.

The boat and assembly were then placed in a sealable bag, typically a zip-lock polyethylene bag and a low positive pressure of inert gas, usually nitrogen, added before sealing the bag. The bag containing the boat and coupon assembly is placed into an oven at 80° C. for up to about 60 minutes. The bag is then removed and cooled, and the now reacted ion exchange membrane coupons are placed in 0.5N NaCl solution at 40° C.-50° C. for at least 30 minutes, with a soak in NaCl solution of up to 18 hours being found satisfactory.

EXPERIMENTAL EXAMPLES

The following examples are meant to illustrate the extent of effort expended in developing the subject membranes. The finding resulted in showing that ion exchange membranes having the desired properties could be made and that improvements are possible with further experimentation. These results are meant to be illustrative and to indicate developmental directions to those skilled in the art of membrane development and associated arts and not to be limiting as to the extent of the matter disclosed herein. Properties and suppliers of the supports used are given in Table 1 below.

TABLE 1

Substrates Used
Porous Substrates

| Trade Name | Manufacturer | Material | Rated Pore Size | Thickness Microns | Porosity % |
|---|---|---|---|---|---|
| APorous H6A | APorous Billerica MA | HDPE | 0.1 | 52 | 68 |
| APorous S14 | | HDPE | 0.1 | 84 | 77 |
| Ahlstrom (Hollytex) | Wall Township, New Jersey | polyester | | 200 | |
| Teklon HPIP32 | Entek Lebanon, OR | UHMWPE | | 32 | 48 |
| Delpore 6002 | Delstar Middleton DE | meltblown | | | |
| Delstar Stratex 3.6SL-G | Delstar Middleton DE | | | | |
| Novatexx 2413 | Freudenberg Hopkinsville, KY | Spunlace polyester | | 558 | |
| Celgard EZ2090 | CELGARD Charlotte NC | pp | | | |
| Celgard EZ2590 | CELGARD Charlotte NC | pp | | 32 | 45 |
| Solupor 16P5A | Lydall Filtration Rochester NH | UHMWPE | 0.5 | 115 | 83% |
| Solupor 16P10A | Lydall Filtration Rochester NH | UHMWPE | 0.9 | 120 | 85% |

Representative porous substrates were tested for baseline permselectivity and resistance. They are pre-washed using isopropanol-ethanol and D.I. water each for 5 minutes, then they were rinsed by 0.5 N NaCl (aq) 3 times testing Table 2 below shows the results of area resistance in Ohm cm$^2$ of AEM thus made and their apparent permselectivity %:

TABLE 2

Characteristics of Selected Substrates

| Description | R (ohm cm$^2$) | Apparent Permselectivity % |
|---|---|---|
| Teklon HPIP | 0.593 | 57.24 |
| Solupor 16P10A | 2.192 | 57.38 |
| Aporous H6A | 0.152 | 57.54 |
| Celgard EZ-2590 | 0.788 | 57.54 |
| Celgard EZ-2090 | 1.159 | 57.38 |

Example 1

In a 4 oz jar with 17.08 g of 1-vinylimidazole, 9.14 g of vinylbenzyl chloride, 5.39 g of divinylbenzene (80%), 16.61 g of benzyl chloride, 20.65 g of dipropylglycol (DPG) and 0.40 g Vazo-64 were combined with stirring. A clear brown solution formed immediately. Substrates Solupor 16P10A, 16PO5A, Teklon, Aporous S14, Celgard EZ2090, EZ2590, Novatexx 2431ND, Delstar 6SLG, Ahlstrom 3329, Delpore DP3924-80PNAT, Delpore 6002-20PNAT were soaked the solution for 1 hour to assure complete pore filling. Then they were sandwiched between Mylar disks, air bubbles between Mylar disks removed by pressure and the sandwiched substrates placed in an aluminum weighting dish. The dish was loaded into a Ziploc® bag, the bag pressurized with nitrogen gas and placed in an 80° C. oven for 1 hour. The membrane coupon thus made was placed in 0.5 N NaCl(aq) for conditioning. Table 3 below shows the results of area resistance in Ohm cm$^2$ of AEM thus made and their apparent permselectivity %:

TABLE 3

| Substrates | R (ohm cm$^2$) | Apparent Perms % |
|---|---|---|
| Ahsltrom 3329 200 micron thick | 31.75 | 92.62 |
| Aporous S14 | 2.145 | 93.11 |
| Celgard X021 (EZ2590) 32 micron thick | 2.68 | 92.78 |
| Teklon HPIP 32 micron thick | 5.00 | 94.26 |
| Solupor 16P05A 115 micron thick | 2.55 | 92.95 |
| Solupor 16P10A 200 micron thick | 3.55 | 92.62 |
| Delpore6002-20PNAT nonwoven | 3.64 | 89.01 |
| Novatexx 2431 NO | 7.51 | 73.03 |
| Delstar 6SLG nonwoven | 12.62 | 87.70 |
| Celgard EZL2090 | 3.29 | 90.52 |
| Delpore6002-20PNAT nonwoven 2nd coupon | 2.35 | 89.86 |

Example 2

In a 4 oz jar with 15.71 g of 1-vinylimidazole, 25.47 g of vinyl benzyl chloride, 13.25 g of DPG and 0.42 g Vazo-64 were combined with stirring. A clear brown solution formed immediately. Substrates Solupor 16P10A, 16PO5A and Teklon HPIP, were soaked the solution for 1 hour to assure complete pore filling.

Then they were sandwiched between Mylar disks, air bubbles between Mylar disks removed by pressure and the sandwiched substrates placed in an aluminum weighting dish. The dish was loaded in to a Ziploc® bag, the bag pressurized with nitrogen gas and placed in an 80° C. oven for 40 minutes. The membrane coupon thus made was placed in 0.5 N NaCl (aq) for conditioning. Table 5 below shows the results of area resistance in Ohm cm$^2$ of AEM thus made and their apparent permselectivity_%.

Also shown are commercially available ion exchange membranes AMX and CMX from Astom-Japan. Both are 125 microns thick.

TABLE 4

| Description | R (ohm cm$^2$) | Apparent Permselectivity % |
|---|---|---|
| Teklon HPIP 32 micron thick | 6.55 | 91.64 |
| Solupor 16P10A 120 micron thick | 3.54 | 92.62 |
| Astom AMX (anion exchange membrane) | 3.13 | 96.07 |
| Astom CMX (cation exchange membrane | 2.37 | 106.50 |

The results in tables 3 and 4 show that membranes made by the inventive method has approximately equivalent properties to much thicker membranes. Thinner membranes allow for increased number of membranes per module or housing volume and therefore more productivity per unit volume.

Example 3

In a 4 oz jar with 17.12 g of 1-vinylimidazole, 20.00 g of vinylbenzyl chloride, 16.00 g of benzyl chloride, 11.02 g of DPG and 0.51 g Vazo-64 were combined with stirring. A clear brown solution formed immediately. Substrates Solupor 16P10A, and Teklon (HPIP, 32 micron, single layer) were soaked in the solution for 1.5 hour to assure complete pore filling.

Then they were sandwiched between Mylar disks, air bubbles between Mylar disks removed by pressure and the sandwiched substrates placed in an aluminum weighting dish. The dish was loaded in to a Ziploc® bag, the bag pressurized with nitrogen gas and placed in an 80° C. oven for 47 minutes. The membrane coupon thus made was placed in 0.5 N NaCl (aq) for conditioning. Table 3 below shows the results of area resistance in Ohm cm² of AEM thus made and their apparent permselectivity %.

Also shown is a commercially available ion exchange membranes AMX from Astom-Japan. Its thickness is 125 micron.

TABLE 5

| Description | R ($\Omega$ cm²) | Apparent |
|---|---|---|
| Teklon HPIP 32 micron | 2.33 | 95.09 |
| Solupor 16P10A 120 micron | 2.17 | 95.57 |
| Astom AMX (anion exchange membrane) | 2.73 | 94.55 |

Example 4

In a 4 oz jar with 8.55 g of 1-vinylimidazole, 10.01 g of vinylbenzyl chloride, 1.02 g of divinyl benzene (80%), 12.01 g of benzyl chloride, 5.61 g of DPG and 0.31 g Vazo-64 were combined with stirring. A clear brown solution formed immediately. Substrates Solupor 16P10A, and Teklon HPIP (single layer), Aporous H6A and Celgard EZ2590, were soaked in the solution for 75 minutes to assure complete pore filling.

Then they were sandwiched between Mylar disks, air bubbles between Mylar disks removed by pressure and the sandwiched substrates placed in an aluminum weighting dish. The dish was loaded in to a Ziploc® bag, the bag pressurized with nitrogen gas and placed in an 80° C. oven for 47 minutes. The membrane coupon thus made was placed in 0.5 N NaCl (aq) for conditioning. Table 6 below shows the results of area resistance in $\Omega$cm² of AEM thus made and their apparent permselectivity_%.

Also shown is a commercially available ion exchange membranes AMX from Astom-Japan. Its thickness is 125 micron.

TABLE 6

| Description | R (ohm cm²) | Apparent Permselectivity % |
|---|---|---|
| Teklon HPIP 32 micron thick | 4.24 | 95.21 |
| Solupor 16P10A 120 micron | 2.62 | 94.71 |
| Aporous H6A, 52 micron | 2.55 | 95.04 |
| Celgard EZ2590, 27 micron | 1.98 | 94.55 |
| Astom AMX (anion exchange membrane) | 2.73 | 94.55 |

Example 5

In an 8 oz jar with 30.7 g of 1-vinylimidazole, 17.2 g of vinyl benzyl chloride, 42.5 g of benzyl chloride, 11.8 g Divinylbenzene (80%), 27.0 g of DPG and 0.41 g Vazo-64 were combined with stirring. A clear brown solution formed immediately. Coupons of substrates Solupor 16P05A were soaked in the solution for 2 hour to assure complete pore filling.

Then they were sandwiched between Mylar disks, air bubbles between Mylar disks removed by pressure and the sandwiched substrates placed in an aluminum weighting dish. The dish was loaded in to a Ziploc® bag, the bag pressurized with nitrogen gas and placed in an 80° C. oven for 1 hour. The membrane coupon thus made was placed in 0.5 N NaCl (aq) for conditioning. Table 7 below shows the results of area resistance in $\Omega$cm² of AEM thus made and their apparent permselectivity %.

Also shown is a commercially available ion exchange membranes AMX from Astom-Japan. Its thickness is 125 micron.

TABLE 7

| Description | | |
|---|---|---|
| Solupor 16P05A, 115 micron | 2.60 | 95.00 |
| Astom AMX (anion exchange membrane) | 3.10 | 95.08 |

Example 6

In a 20 ml vial with 3.43 g of 1-vinylimidazole, 3.0 of vinylbenzyl chloride, 1.0 gm EP0409 (Hybrid Plastics, glycidyl-POSS® cage mixture CAS#68611-45-0), 3.2 g of benzyl chloride, 2.20 g of DPG and 0.10 g Vazo-64 were combined with stirring. A clear brown solution formed immediately. Coupons of substrate Solupor 16P10A were soaked in the solution for 0.5 hour to assure complete pore filling.

Then they were sandwiched between Mylar disks, air bubbles between Mylar disks removed by pressure and the sandwiched substrates placed in an aluminum weighting dish. The dish was loaded in to a Ziploc® bag, the bag pressurized with nitrogen gas and placed in an 90° C. oven for 1 hour. The membrane coupon thus made was placed in 0.5 N NaCl (aq) for conditioning. Table 8 below shows the result of area resistance in Ohm cm² of AEM thus made and their apparent permselectivity_%.

Also shown is a commercially available ion exchange membranes AMX from Astom-Japan having a thickness is 125 micron.

TABLE 8

| Description | R (Ohm cm²) | Apparent Permselectivity % |
|---|---|---|
| Solupor 16P10A, 120 micron | 2.59 | 93.92 |
| Astom AMX (anion exchange membrane) | 2.42 | 93.59 |

Experiment Procedures for Membrane Area Resistivity and Apparent Permselectivity Characterization The membrane resistance and counter ion transport number (permselectivity) can be measured using an electrochemical cell. This bench top experiment provides us with a very effective and quick experiment using a small piece of sample. The equipment and procedure are described here.

Experiment Preparation (1) Solartron 1280 Electrochemical Measurement Unit

The Solartron 1280 electrochemical measurement unit enables us to apply a current between the two platinum electrodes on the two sides of the cell and to measure the voltage drop across membrane. It has 4 connectors: work electrode (WE), counter electrode (CE), Reference electrodes (RE1 and RE2). The CE and WE are used to apply current and RE1 and RE2 to measure the voltage drop.

(2) Reference Electrodes

Reference electrodes (see the insert in FIG. 1) used for membrane characterization are made in R&D lab. ¼ glass tubing is softened, then bent and drawn to the form shown. A porous plug is inserted in the tip to control solution flow to a low rate.

Silver/silver chloride wire is freshly made for each day's testing. A current of 2-3 mA was supplied and controlled by a power supplier and an ampere meter to a platinum wire cathode and silver wire anode immersed in a 0.1N HCl solution. After several minutes, the sliver wire starts to turn black, indicating the formation of AgCl layer on the surface. The solution used inside the reference electrode tubing is 1.0M KCl solution. Since the solution will leak through the porous tip, constant addition of KCl is a necessary (every 20 min) during experiment.

(3) Membrane Test Cell

FIG. 1 shows the detailed electrochemical testing cell construction used for the experiment to measure resistance and counter ion permselectivity of the membrane. The membranes are cut into disc using a die cutter. The reference electrodes are used to monitor the voltage drop across the testing membrane and the 2 platinum discs are used to provide a current through the membrane. The cylindrical path of the cell has a cross section area of 7.0 cm$^2$ (4) Solutions All the solutions need to be prepared with quantitative level as indicated by their significant figures. These includes 0.500N NaCl, 1.0N HCl and NaOH (caustic, using plastic container or volumetric flask). The 0.5N Na$_2$SO$_4$ is used to feed the electrode compartments without evolution of chlorine gas.

3-111. Measurement Procedures (1) Resistance Measurement

Resistance here refers to area resistance Ω-cm$^2$. The measurement contains 3 steps.

(a) Set up electrode positions: Prior to a measurement, the reference electrode horizontal positions are set. To set reference electrode position, a rigid plastic disc is used as a stand-in for the membrane. Each reference electrode is adjusted to just touch the plastic disc and their position fixed by two set screws.

(b) Measure the solution conductivity: The plastic disc was then removed and the two reference electrodes moved to 1.0 cm apart by removing the two 0.50 mm plastic blocks. The voltage drop between the two reference electrodes is recorded at an applied a current (~10-50 mA) by the Solartron 1280. The distance of the 2 reference electrodes (1.00 cm here), the current density (10.00 mA) and voltage (to 0.1 mV precision) used to obtain the conductivity of the solution (0.50 N NaCl typically).

(c) Measuring membrane resistance: The membrane sample is then placed by the sample slider and the voltage and current measured again. The resistance of membrane is the total resistance less the solution resistance measured in procedure (b)

(2) Counter Ion Permselectivity (Transport Number)

The measurement procedures are:

(a) Reference electrode position is set as described by part(a) of Resistance measurement. The reference electrodes position may be approximate since the voltage measured in this test is theoretically independent of the distance, but it is recommended that the position be located as reproducibly as possible.

(b) Solutions: After emplacing the sample membrane with the slider, pour 0.500N NaCl solution in the right part of the cell separated by the testing membrane and 0.250NNaCl on the left side of the cell.

(c) Measuring the voltage: the voltage was measured (without applying current) using a voltage meter attached to the platinum electrodes and data were entered the spreadsheet to obtain counter ion permselectivity.

3-IV. Sample Calculations:
C=conductivity (siemens/cm)
p=resistance (ohms/cm)
R=resistivity (ohm-cm2 or Ωcm2)
A=area (cm$^2$)
U, V=measured voltage (mV)
I=measured current (mA)
L=distance between reference electrodes (1) Conductivity of the 0.500 M NaCl at 10.00 mA current and 33.1 mV measured for a reference electrode distance of 1.00 cm, the conductivity of solution:

$$C = \frac{1}{\rho} = \frac{L}{R} = \frac{L}{\frac{U}{I} \times A} = \frac{1.00 \text{ cm}}{\frac{33.1 \text{ mV}}{10.0 \text{ mA}} \times 7.00 \text{ cm}^2} = 0.0432 \text{ S/cm}$$

(2) Area resistance of the membrane calculation needs to subtract the solution resistance. For a CMX membrane with a measured potential of 38.0 mV, the area resistance is:

$$R = \frac{(38.1 - 33.1) \text{ mV}}{10.0 \text{ mA}} \times 7.00 \text{ cm}^2 = 3.42 \Omega \cdot \text{cm}^2$$

(3) Permselectivity (transport number) of anion(+) or anion(−) membrane T± is obtained by:

$$V = (2T_\pm - 1)\frac{RT}{F}\ln\frac{a_L}{a_R}$$

Which rearranges to;

$$2T_\pm = 1 + VF/RT\left(\ln\frac{a_R}{a_L}\right)$$

Where V is measured voltage by the reference electrodes, R is gas constant (8.314 Joule·K$^{-1}$·mole$^{-1}$) T is Kelvin temperature of solution, F is Faraday constant (96480 coulomb/mole) and $a_R$ and $a_L$ are concentration (activity format) of the solution on the two sides of the membrane in the cell.

The invention claimed is:
1. An anion exchange membrane, comprising:
a microporous membrane support having a porous first side, a porous second side, and a continuous porous structure comprising pores having a size of about 0.05 microns to about 10 microns extending from said first side to said second side; and a crosslinked ion transferring polymer filling said continuous porous structure, said polymer formed in the porous structure from a polymer solution comprising a vinyl compound having nitrogen containing rings, the anion exchange membrane having a permselectivity of greater than about 92%.

2. The anion exchange membrane of claim 1, wherein the vinyl compound is selected from the group consisting of vinylimidazole and vinylcarbazole.

3. The anion exchange membrane of claim 1, wherein the polymer solution further comprises at least one crosslinking monomer, at least one quaternizing agent, and at least one polymerization initiator.

4. The anion exchange membrane of claim 2, wherein the at least one crosslinking monomer is selected from the group consisting of: divinylbenzene, ethylene glycol dimethacrylate, vinylbenzyl chloride, dichloroethane, propylene glycol dimethacrylate, isobutylene glycol dimethacrylate, $C_{16}H_{24}O_{12}Si_8$, $C_{32}H_{72}O_{20}Si_{16}$, $(CH_2CH)_n(SiO_{1.5})_n$ wherein n=8, 10, or 12, $C_{14}H_{38}O_{12}Si_7$, $C_{28}H_{66}O_{12}Si_7$, $C_{56}H_{122}O_{12}Si_7$, $C_{16}H_{56}O_{20}Si_{16}$, $H_8O_{12}Si_8$, $(C_8H_{13}O)_n(SiO_{1.5})_n$ wherein n=8, 10, 12, $(C_6H_{11}O_2)_n(SiO_{1.5})_n$ wherein n=8, 10, or 12, $(C_7H_{11}O_2)_n(SiO_{1.5})_n$ wherein n=8, 10, or 12, and $(C_6H_9O_2)_n$ wherein n=8, 10, or 12.

5. The anion exchange membrane of claim 3, wherein the at least one quaternizing agent is selected from the group consisting of benzyl chloride, benzyl bromide, vinyl benzyl chloride, dichloroethane, or methyl iodide.

6. The anion exchange membrane of claim 3, wherein the at least one polymerization initiator is selected from the group consisting of organic peroxides, 2,2' azobis[2,[2-imidazolin-2-yl]-propane] dihydrochloride, a,a'-azoisobutyronitrile, 2,2'-azobis[2-methylpropioaminidine]dihydrochloride, 2,2' azobis[2, [2-imidazolin-2-yl]propane], or dimethyl 2,2'azobis[2-methylpropionate.

7. The anion exchange membrane of claim 6, wherein the organic peroxide is benzoyl peroxide.

8. The anion exchange membrane of claim 3, wherein the polymer solution further comprises at least one polymerization inhibitor.

9. The anion exchange membrane of claim 8, wherein the at least one polymerization inhibitor is selected from the group consisting of 4-methoxyphenol and 4-tert-butyl catechol.

10. The anion exchange membrane of claim 1, wherein the microporous membrane support comprises polypropylene, high molecular weight polyethylene, ultrahigh molecular weight polyethylene or polyvinylidene fluoride.

11. The anion exchange membrane of claim 1, wherein the thickness of the microporous membrane support is greater than about 55 microns and less than about 155 microns.

12. The anion exchange membrane of claim 1, wherein the thickness of the microporous membrane support is greater than about approximately 20 microns and less than about 55 microns.

13. The anion exchange membrane of claim 1, wherein the microporous membrane support has a pore size of from about 0.1 microns to about 1.0 microns.

14. The anion exchange membrane of claim 13, wherein the microporous membrane support has a pore size of from about 0.1 microns to about 0.2 microns.

15. A process for producing an ion exchange membrane, comprising:

choosing a porous substrate having a porous first side, a porous second side, and a continuous porous structure extending from the first side to the second side, the continuous porous structure comprising pores having a size of about 0.05 microns to about 10 microns;

saturating the porous regions of the substrate with a monomeric solution comprising a vinyl compound having nitrogen containing rings;

removing excess solution from the substrate while leaving the continuous porous structure filled with solution; and initiating polymerization to form a crosslinked anion exchange polymer in the continuous porous structure of the substrate, the ion exchange membrane having a permselectivity of greater than about 92%.

16. The process of claim 15, wherein the vinyl compound is selected from the group consisting of vinylimidazole and vinylcarbazole.

17. The process of claim 15, wherein the monomeric solution further comprises at least one crosslinking monomer, at least one quaternizing agent, and at least one polymerization initiator.

18. The process of claim 17, wherein the at least one crosslinking monomer is selected from the group consisting of: divinylbenzene, vinylbenzyl chloride, dichloroethane, an octaglycidyl-polyhedral oligomeric silsequioxane or ethylene glycol dimethacrylate.

19. The process of claim 17, wherein the at least one quaternizing agent is selected from the group consisting of benzyl chloride, vinyl benzyl chloride, dichloroethane, or methyl iodide.

20. The process of claim 17, wherein the at least one polymerization initiator is selected from the group consisting of organic peroxides, 2,2'-azobis[2,(2-imidazolin-2-yl)-propane] dihydrochloride, a,a'azoisobutyronitrile, 2,2'-azobis(2-methylpropioaminidine) dihydrochloride, 2,2'-azobis[2,(2-imidazolin-2-yl)-propane], and dimethyl 2,2'-azo bis (2-methyl propionate).

21. The process of claim 20, wherein the organic peroxide is benzoyl peroxide.

22. The process of claim 17, wherein the monomeric solution further comprises at least one polymerization inhibitor.

23. The process of claim 22, wherein the at least one polymerization inhibitor is selected from the group consisting of 4-methoxyphenol and 4-tert-butyl catechol.

24. The process of claim 15, wherein the porous substrate comprises polypropylene, high molecular weight polyethylene, ultrahigh molecular weight polyethylene or polyvinylidene fluoride.

25. The process of claim 15, wherein the thickness of the porous support is greater than about 55 microns and less than about 155 microns.

26. The process of claim 15, wherein the thickness of the porous support is greater than about 20 microns and less than about 55 microns.

27. The process of claim 15, wherein the porous substrate has a pore size of from about 0.1 microns to about 1.0 microns.

28. The process of claim 27, wherein the porous substrate has a pore size of from about 0.1 microns to about 0.2 microns.

* * * * *